United States Patent [19]

Berkcan et al.

[11] Patent Number: 5,541,503
[45] Date of Patent: Jul. 30, 1996

[54] ALTERNATING CURRENT SENSOR BASED ON CONCENTRIC-PIPE GEOMETRY AND HAVING A TRANSFORMER FOR PROVIDING SEPARATE SELF-POWERING

[75] Inventors: Ertugrul Berkcan, Schenectady, N.Y.; Raymond K. Seymour, Plainville, Conn.

[73] Assignee: General Electric Company, Schenectady, N.Y.

[21] Appl. No.: 342,504

[22] Filed: Nov. 21, 1994

[51] Int. Cl.⁶ .............................. G01R 33/00; G01R 1/20
[52] U.S. Cl. ...................................... 324/127; 324/117 R
[58] Field of Search .................................. 324/126, 127, 324/117 R, 107, 108, 133, 251, 252; 338/49, 61, 272; 336/82

[56] References Cited

U.S. PATENT DOCUMENTS

| | | | |
|---|---|---|---|
| 2,440,679 | 5/1948 | Fountain | 324/126 |
| 4,182,982 | 1/1980 | Wolf et al. | |
| 4,492,919 | 1/1985 | Milkovic | |
| 4,580,095 | 4/1986 | DeVries | |
| 4,894,610 | 1/1990 | Friedl | |
| 5,066,904 | 11/1991 | Bullock | |
| 5,107,204 | 4/1992 | Bullock et al. | |
| 5,416,408 | 5/1995 | Berkcan et al. | 324/127 |
| 5,420,504 | 5/1995 | Berkcan | 324/126 |
| 5,438,257 | 8/1995 | Berkcan | 324/117 R |

OTHER PUBLICATIONS

"Split–Conductor Current Sensors with Electronic Load Termination", Miran Milkovic, IEEE Transactions on Instrumentation and Measurement, vol. 41, No. 4, Aug. 1992, pp. 540–547.

"Electrical Measurements" by Frank A. Laws, Massachuseets Institute of Technology, 1938, pp. 72–75.

*Primary Examiner*—Vinh P. Nguyen
*Attorney, Agent, or Firm*—Marvin Snyder

[57] ABSTRACT

An alternating current sensor includes a conductive pipe and a cylindrical-shaped conductive element preferably partially surrounded by the pipe. The pipe is substantially concentric to the conductive element and a conductor electrically connects a pair of corresponding ends of the pipe and conductive element to form a connected conductive path through the sensor. The pipe and the conductive element are spaced apart a predetermined radial distance to form a magnetic field in the space between the pipe and the conductive element during current flow along the connected conductive path. A flux sensor, such as an air-core coil, senses changes in magnetic flux over a sense region situated in the space between the pipe and the conductive element. A transformer having a saturable magnetic core is responsive to a magnetic field over a transformer region for generating a predetermined level of electrical current which can be used for safely powering various electrical circuits associated with the current sensor.

23 Claims, 6 Drawing Sheets fig. 1 fig. 2 fig. 3 fig. 4 fig. 5 fig. 6a fig. 6b fig. 7 fig. 8 fig. 9a fig. 9b

ALTERNATING CURRENT SENSOR BASED ON CONCENTRIC-PIPE GEOMETRY AND HAVING A TRANSFORMER FOR PROVIDING SEPARATE SELF-POWERING

RELATED APPLICATIONS

This application is related to U.S. patent application Ser. No. 08/342,510, entitled "An Alternating Current Sensor Employing Parallel Plates And Having High Dynamic Range and Accuracy" by E. Berkcan; U.S. patent application Ser. No. 08/342,505 entitled "Alternating Current Sensor Based On Parallel-Plate Geometry And Having a Shunt For Self Powering" by E. Berkcan et al.; U.S. patent application Ser. No. 08/342,503 entitled "Alternating Current Sensor Based On Parallel-Plate Geometry And Having A Conductor For Providing Separate Self-Powering" by E. Berkcan et al. All applications are pending. Each of the above-listed applications is filed concurrently with the present application, assigned to the assignee of the present invention and herein incorporated by reference.

FIELD OF THE INVENTION

The present invention relates to a current sensor and, more particularly, to an alternating current sensor based on concentric-pipe geometry and having a transformer for separate self-powering.

BACKGROUND OF THE INVENTION

Current sensors that are based on concentric-pipe geometry are generally known in the art. However, in a three-phase system or network such current sensors may have problems regarding the sensitivity or accuracy of the current sensor due to mutual coupling of alternating voltages provided between the three phases.

Techniques are known to reduce the mutual coupling between the current sensors in such a three-phase network or system. One technique for accomplishing this is to introduce magnetic insulation. Unfortunately, such magnetic insulation may introduce other problems in that the insulation may become saturated due to the strength of components of the magnetic field and, furthermore, such insulation may not be economical for some current sensing applications or may introduce additional size and bulk, especially due to the need for materials able to provide satisfactory insulation.

Another disadvantage encountered in known current sensor scan be the need for a relatively expensive current shunt which is meticulously designed for providing a highly accurate current measurement. For instance, use of such current shunt helps somewhat to reduce the size, weight, and expense of the current sensor by reducing the number of ampere-turns in the active part of the current sensor such as in a zero-flux detection technique. However, even the use of an accurate current shunt typically introduces some expense due to the current sensor materials, such as low temperature coefficient materials, the large number of coil "turns" in the sensing and feedback coils on the current shunt, as well as the manufacturing care required to fabricate the current sensor. Thus, a need exists for a current sensor and method for overcoming these problems.

Moreover, since current sensors typically have associated circuitry, such as signal conditioning circuits, signal processing circuits, control circuits and the like, it is also desirable for the current sensor to have a self-powering capability which allows for electrically powering such associated circuits in a manner which avoids the need for any current shunt and which is essentially independent or separate from any current measurement or current sensing operation being performed in the current sensor. This is particularly desirable since the respective design and accuracy requirements of any current shunt and associated transformer elements, such as the transformer core and coil, that are employed both for current sensing and for self-powering, are typically much more demanding or restrictive than would be the respective design and accuracy requirements of transformer elements which are exclusively dedicated for self-powering. For example, this would advantageously allow for further reducing the size, weight, and cost of the current sensor due to the greater flexibility of design and lower expense of transformer elements which are exclusively dedicated for self-powering, as compared to a current shunt and transformer elements which must also provide highly accurate current measurements. Moreover, high-power circuit breaker applications generally require current sensors having a high dynamic range and accuracy while maintaining a relatively low cost and size.

SUMMARY OF THE INVENTION

Generally speaking the present invention fulfills the foregoing needs by providing an alternating current sensor that comprises a conductive pipe and a cylindrical-shaped conductive element at least partially surrounded by the pipe. The pipe is substantially concentric to the conductive element and a conductor electrically connects a pair of corresponding ends of the pipe and conductive element to form a connected conductive path through the sensor. The pipe and the conductive element are spaced apart a predetermined radial distance to form a magnetic field in the space between the pipe and conductive element during current flow along the conductive path. A sensor, such as an air-core coil, senses changes in magnetic flux over a predetermined sense region situated between the pipe and the conductive element. A transformer having a suitable magnetic core is responsive to a magnetic field over a transformer region for generating a predetermined level of electrical current which, for example, can be used for safely powering various electrical circuits associated with the current sensor. Preferably, the sense and transformer regions are substantially nonoverlapping with respect to one another.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof may be best be understood by reference to the following detailed description when read with the accompanying drawings in which:

DETAILED DESCRIPTION OF THE INVENTION

Figure 1:
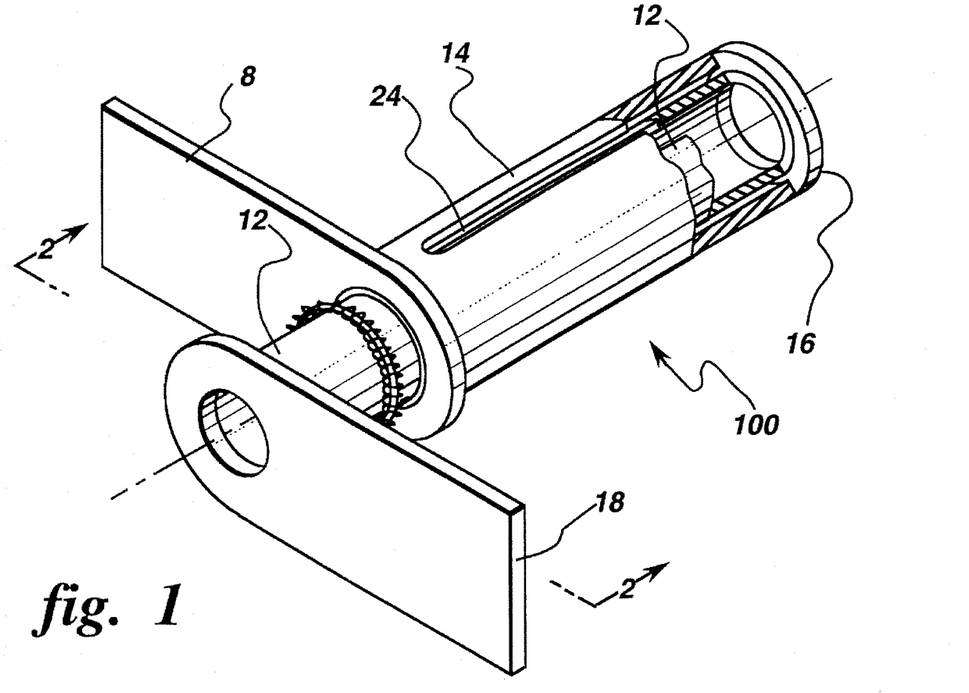
FIG. 1 shows an isometric, partially cut-away view of one embodiment of a current sensor including a transformer for powering in accordance with the invention.
Figure 2:
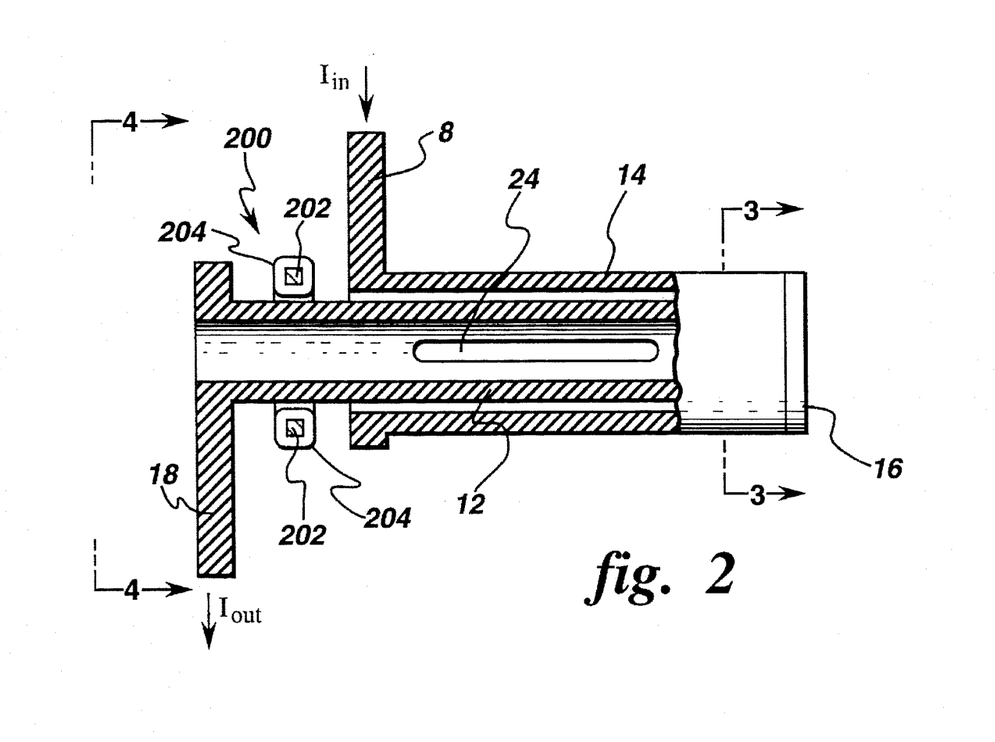
FIG. 2 shows a partially cut-away cross-sectional top view of the embodiment of FIG. 1.

FIG. 1 illustrates one embodiment of a current sensor 100 having a self-powering capability which is substantially separate or independent from any current measurement or sensing operation being performed in the current sensor in accordance with the invention. As illustrated in FIG. 2, input current, $I_{in}$, is carried by a conductor 8, such as a conductive plate, to a pair of nested concentric metal pipes or hollow cylinders, cylinder 12 being the inner cylinder and cylinder 14 being the outer cylinder. Inner cylinder 12 may alternatively take the form a solid cylindrical-shaped conductive element, although in this particular embodiment the conductive element is hollowed along its major axis extending from a first end to a second end to form a pipe. The outer cylinder 14 also forms a conductive pipe having a first end, a second end, and a major axis extending from the first end to the second end.

Inner pipe 12 is at least partially surrounded by outer pipe 14 and has a major axis substantially coincident with the major axis of the outer pipe. Furthermore, in this particular embodiment, the inner pipe has a first end extending beyond the first end of the pipe and a second end substantially coplanar with the second end of the pipe. Nonetheless, the invention is not limited in scope to embodiments in which the current sensor has one end in which the concentric pipes are coplanar. Likewise, the invention is not limited in scope to embodiments in which the end of one pipe extends beyond the corresponding end of the other pipe.

A conductive end piece or washer 16 electrically and physically connects the respective second ends of the pipe and the cylindrical element together. Except for end-piece 16, an insulating material, such as an air gap or other insulating material, such as Kapton™ available from the Du Pont Company, isolates the inner surface of the outer pipe from the outer surface of the inner pipe. Thus, a connected path for current flow is thereby established, such as further illustrated in FIG. 2. The current, $I_{out}$, leaves the current sensor by conductor 18.

Figure 3:
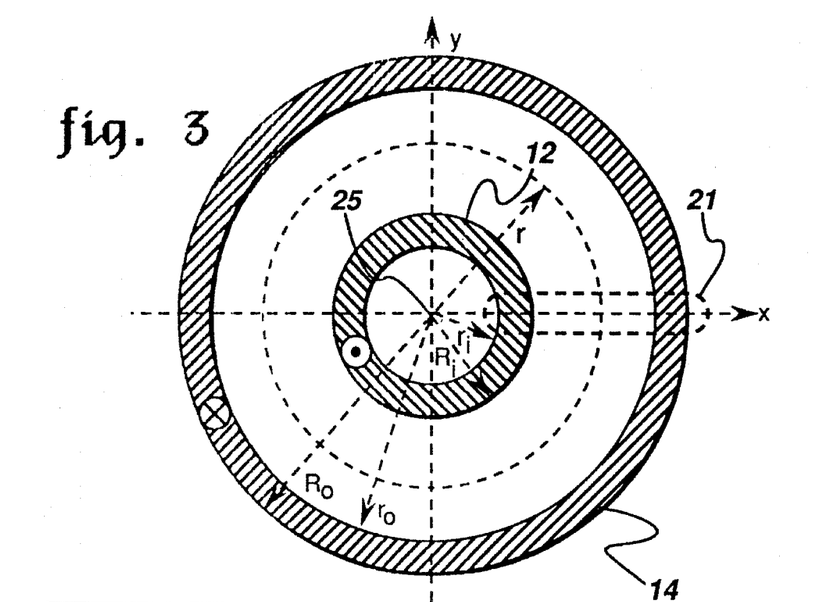
FIG. 3 shows a cross-sectional front view of the embodiment of FIG. 2 taken through the plane illustrated in FIG. 1 substantially perpendicular to the major axis of that embodiment.

As best shown in FIG. 3, the inner pipe and the outer pipe are preferably spaced apart a predetermined radial distance to form a magnetic field in the space between the pipe and the conductive element during current flow along the connected conductive path. As shown in FIGS. 1 and 2, both the inner pipe and the outer pipe, in this particular embodiment, have slots or openings 24 extending from the outer surface of outer pipe 14 to the inner surface of inner pipe 12. However, in an embodiment in which a solid conductive element is employed in place of pipe 12, the slot extends only from the outer surface to the inner surface of pipe 14.

Figure 4:
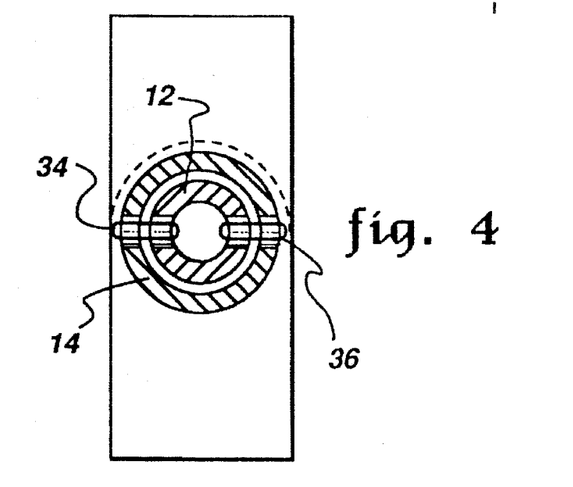
FIG. 4 shows a back cross-sectional view of the embodiment of FIG. 1.

Another slot or opening may also be located on the opposite side of the current sensor, as illustrated in FIG. 4 showing a cross-sectional back view of the embodiment of the current sensor illustrated in FIG. 1. The embodiment of FIG. 1 further includes elements or sensors for sensing magnetic flux changes, i.e., the time rate of change in magnetic flux, such as coils 34 and 36 illustrated in FIG. 4, adapted to be received within the respective slots. For instance, as best shown in FIG. 4, coils 34 and 36 can be designed to have sufficiently thin walls to pass through the respective slots. More particularly, the changing magnetic flux sensors or sensing elements are adapted to interact with the time varying magnetic field produced over a predetermined sense region during current flow along the conductive path through the current sensor. It will be appreciated that in this embodiment the sense region is conveniently situated substantially in the space between the pipe and the conductive element. The cross-sectional area of the sensing element may be oriented at a predetermined angle with respect to the direction of the magnetic field of the current sensor. This is illustrated in FIG. 3 by induction loop 21, although any conducting path through which the flux of the magnetic field passes will suffice. In this particular embodiment, the cross-sectional area of the sensing element or sensor for sensing changes in magnetic flux is oriented substantially perpendicular to the direction of a magnetic field substantially uniform in angular direction relative to the major axis of the current sensor. Thus, this particular embodiment of current sensor 100 is adapted to produce a magnetic field within the current sensor substantially uniform in angular direction during current flow along the conductive path of the current sensor.

Current sensor 100 uses the measurement of the voltage generated as a result of the time rate of change of the magnetic flux through the coils inserted or positioned in slob 24, respectively, for sensing the value of the current flow. In this particular embodiment, the voltage due to the emf is measured across the coils connected in series in a reverse configuration. This series connection has an advantage in that it provides twice as much voltage signal in comparison with a single slot and a single coil. Likewise, external uniform magnetic fields are canceled due to the reverse series connection, an advantage associated with producing a magnetic field substantially uniform in angular direction.

FIGS. 1 and 2 further show transformer means such as a current transformer, responsive to a magnetic field over a predetermined transformer region for generating a predetermined level of electrical current suitable for electrically powering one or more circuits (not shown) associated with the current sensor. As shown in FIG. 1, transformer means 200 comprises a magnetic core 202 shown, for example, around conductive element 12 between the respective first ends of conductive element 12 and outer pipe 14. A winding 204 is responsive to magnetic flux changes in magnetic core 202 to supply the predetermined level of electrical current for the self-powering operation.

Figure 5:
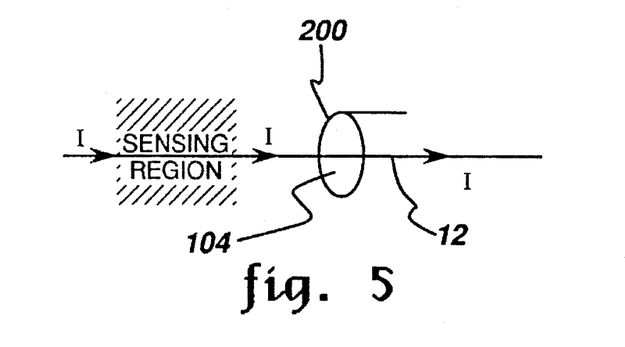
FIG. 5 shows an exemplary equivalent circuit model of a current sensor in accordance with the invention.

As shown in FIG. 5, the sense region and transformer region 104 are preferably substantially nonoverlapping with respect to one another so as to conveniently enable respective sensing and self-powering operations which, as previously suggested, are essentially independent or separate from one another. These separate operations advantageously avoid the use of any current shunt in the current sensor in accordance with the invention and also allow transformer 200 to have a much smaller weight, size and cost than would be feasible if a shunt and transformer were employed for performing a highly accurate current measurement or sensing. For example, any magnetic core used with accurate shunts for precisely sensing current, (or for both sensing current and self-powering) must be carefully designed to have magnetic characteristics suitable for avoiding various undesirable magnetic effects, such as magnetic saturation conditions and other non-linear magnetic effects. Thus, the designer is typically forced to carefully choose from materials having a relatively high magnetic saturation density and to choose dimensions which generally result in oversized, heavy and bulky elements for any current shunt and associated transformer. Similarly, such accurate shunts and their associated transformers must be carefully designed to avoid thermal effects such as resistance heating which, if uncorrected, can detrimentally affect the current sensing accuracy. In contrast, the transformer elements in accordance with the present invention, i.e., transformer elements which are exclusively used for self-powering and not for accurate current sensing, can now be fabricated using uncomplicated and straightforward design techniques which conveniently result in lighter, smaller and cheaper elements than would be possible if the respective sensing and self-powering applications were not independently conducted in accordance with the present invention.

Due to the geometry employed, as explained in more detail hereinafter, substantially all of the magnetic field which interacts with the flux sensor is essentially limited or contained in the space between the inner surface of inner conductive element 12 and the outer surface of outer pipe 14. This provides a number of advantages, not the least of which being that the use of a current sensor having the above-described self-powering in a three-phase system reduces or substantially eliminates the mutual coupling between the current sensors thus improving the sensitivity and accuracy of the current measurements obtained. Both outer pipe 14 and inner pipe 12, or the alternative cylindrical-shaped element, may be manufactured using materials having a small temperature coefficient of resistance, such as on the order of 20 ppm per degree centigrade, such as may be provided by metal alloys including ADVANCE™, KARMA™, NIKROTHALLX™, as well as other materials. Likewise, various metals, such as copper, silver, or gold, and combinations thereof may be employed.

FIG. 3 illustrates a cross-sectional front view of the embodiment illustrated in FIG. 1 taken through the plane illustrated in FIG. 1 perpendicular to the outer wall of pipe or outer cylinder 14. The magnitude of the magnetic field within various concentric circles substantially centered about point 25 is provided by the following equations:

$$H(r) = \begin{cases} 0, & r \leq r_i, r \geq R_o \\ \dfrac{I}{2\pi r} \dfrac{r^2 - r_i^2}{R_i^2 - r_i^2} & r_i \leq r \leq R_i \\ \dfrac{I}{2\pi r} & R_1 \leq r \leq r_o \\ \dfrac{I}{2\pi r} \dfrac{R_o^2 - r^2}{R_o^2 - r_o^2} & r_o \leq r \leq R_o \end{cases} \quad [1]$$

where I is the current along the conductive path of the current sensor, H(r) is the magnitude of the magnetic field in the region indicated, and, as illustrated in FIG. 3, r, $r_i$, $r_o$, $R_o$ and $R_i$ constitute the respective radii of cylinders centered about point 25 on the major axis of pipes 12 and 14 as follows:

$r_i$ is the radius of the inner surface of pipe 12;

$R_i$ is the radius of the outer surface of pipe 12;

$r_o$ is the radius of the inner surface of pipe 14;

$R_o$ is the radius of the outer surface of pipe 14, and r is the radius of an imaginary concentric cylinder centered about point 25 within the current sensor.

As the previous expressions illustrate, the magnetic field induced by the current flow through the current sensor is substantially null in the space within inner cylinder 12 and the space outside outer cylinder 14. Thus, one advantage of using an inner pipe instead of a solid conductive cylindrical element is that the energy of the magnetic field interacting with the flux sensor is concentrated between the pipes. In those embodiments in which the cylindrical-shaped element is not hollowed the magnetic field would not be null in the space occupied by the element because current flow would take place through the element.

It will be appreciated that the current sensor having the self-powering in accordance with the present invention can be conveniently employed by way of example and not of limitation in a mutually inductive current sensing scheme.

Although the flux may be calculated for the general case by the following equation $$\mu_o \int_s \overline{H}(r) \cdot \overline{ds} = \Phi, \quad [2]$$

the following special case of a constant ratio provides a useful embodiment:

$$\rho = \frac{R_i}{r_i} = \frac{R_o}{r_o}. \quad [3]$$

For this case by performing the relevant integration of the magnetic flux indicated by equation [2], the following equation is obtained:

$$\phi = \mu_o \frac{NLI}{2\pi} \ln\left(\frac{r_o}{r_i}\right), \quad [4]$$

where $\mu_o$ is the permeability of free space, L is the length of a loop in the direction substantially parallel to the major axis of the sensor, N is the number of turns in the loop, and I is the current, as previously indicated.

A current sensor which employs separate self-powering in accordance with the present invention and which also employs a mutually inductive current sensing scheme has a number of advantages. First, as previously suggested, there is substantially no magnetic field indicative of the current to be measured or sensed inside or outside the two cylinders. Thus, the magnetic field used for self-powering is essentially independent from the magnetic field between the two concentric cylinders. This is particularly advantageous for metering applications, where, as previously discussed, several current sensors are employed in close proximity to each other, such as in a three-phase network. Likewise, this avoids the need for magnetic insulation which is undesirable and, furthermore, may not provide effective insulation in the presence of strong magnetic fields with DC components in which the material may be saturated. Yet another advantage is that the current sensor is relatively insensitive to external magnetic fields and other sources of noise. This occurs because the sensing elements or sensors for sensing changes in magnetic flux are coupled in series in a reverse configuration so that the effects of substantially uniform external magnetic fields essentially cancel due to the changes in magnetic flux through the sensing elements This insensitivity also applies in relation to direct current where no voltage would be induced due to the absence of a changing magnetic flux. Yet another advantage of a current sensor in accordance with the invention is that the magnetic flux is concentrated in the space constituting the predetermined radial distance or separation between the inner surface of the outer pipe and the outer surface of the inner cylindrical element or pipe, thus improving accuracy in addition to simplifying the current sensor structure, and making it relatively easy to manufacture. Furthermore, several sensing elements or sensors for sensing the time rate of change of magnetic flux may be inserted at arbitrary locations between the outer pipe and the inner cylindrical conductive element, thus providing a better measurement of the current due to the improved signal obtained, as previously suggested.

A number of other embodiments of a current sensor employing a mutually inductive current sensing scheme are likewise possible. For example, a ferromagnetic material, such as ferrite or µ-metal, can be inserted between the inner surface of outer pipe 14 and the outer surface of the inner pipe or cylindrical element 12. The ferromagnetic material may readily be inserted by employing any one of various commonly known manufacturing techniques which take into account the volumetric requirements of any specific design. This may have the desirable effect of increasing the sensitivity of the current sensor still further by increasing the concentration of the magnetic field in the space between the pipes.

Figure 6A:
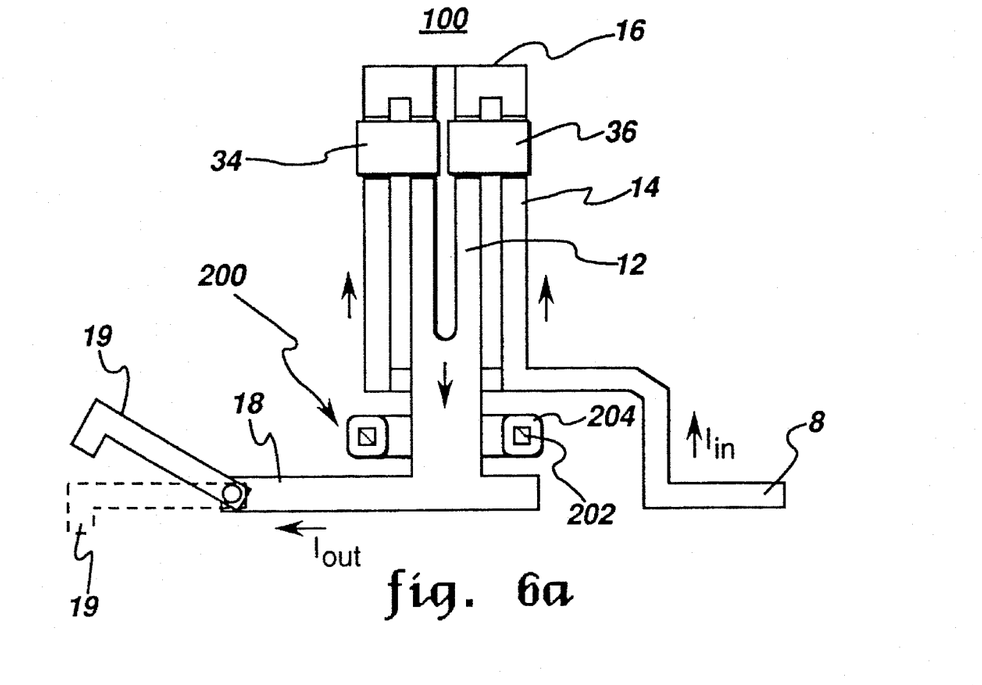
FIGS. 6a and 6b show, respectively, generally schematic side views of alternative embodiments of a current sensor in accordance with the invention.
Figure 6B:
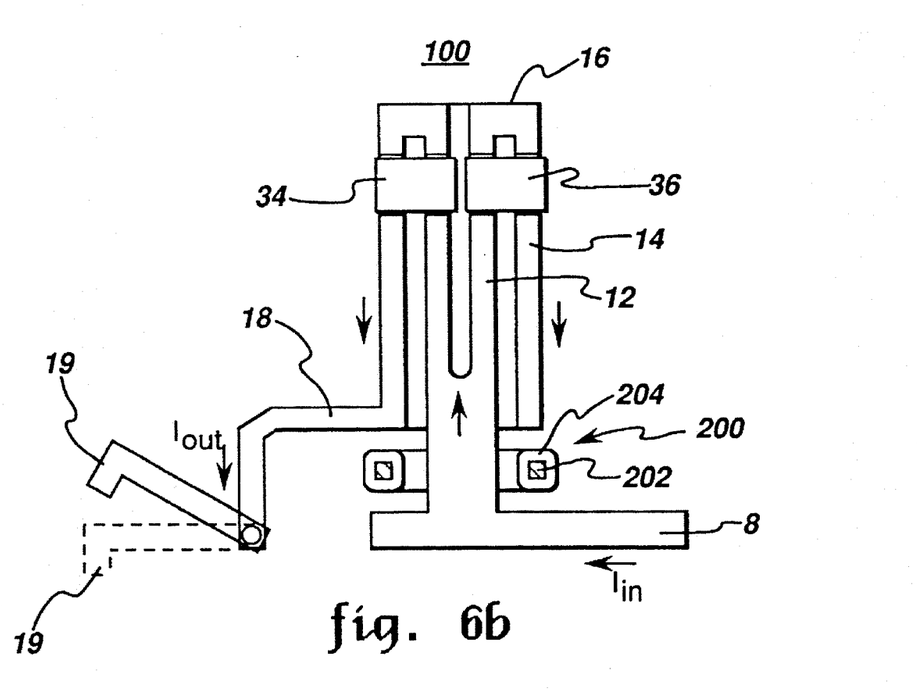

FIGS. 6a and 6b illustrate respective current sensor embodiments which, for example, can be conveniently employed in circuit breaker applications and the like. As shown in FIG. 6a, conductor 8, which carries the current to be measured or sensed by the current sensor, is connected to outer pipe 14, whereas conductor 18, which supplies the current leaving the current sensor, is connected to inner pipe 12. As shown in FIG. 6b, other arrangements are equally effective for respective conductors 8 and 18 so long as current flow in the inner and outer pipes is in mutually opposite directions with respect to one another. In each case, a contact arm 19 is connected to conductor 18 so that, depending on the level of the current being sensed or measured by the current sensor, contact arm can be actuated or pivoted to an electrically closed position (represented by the dashed line contact arm) or to an electrically open position (represented by the solid line contact arm).

Figure 7:
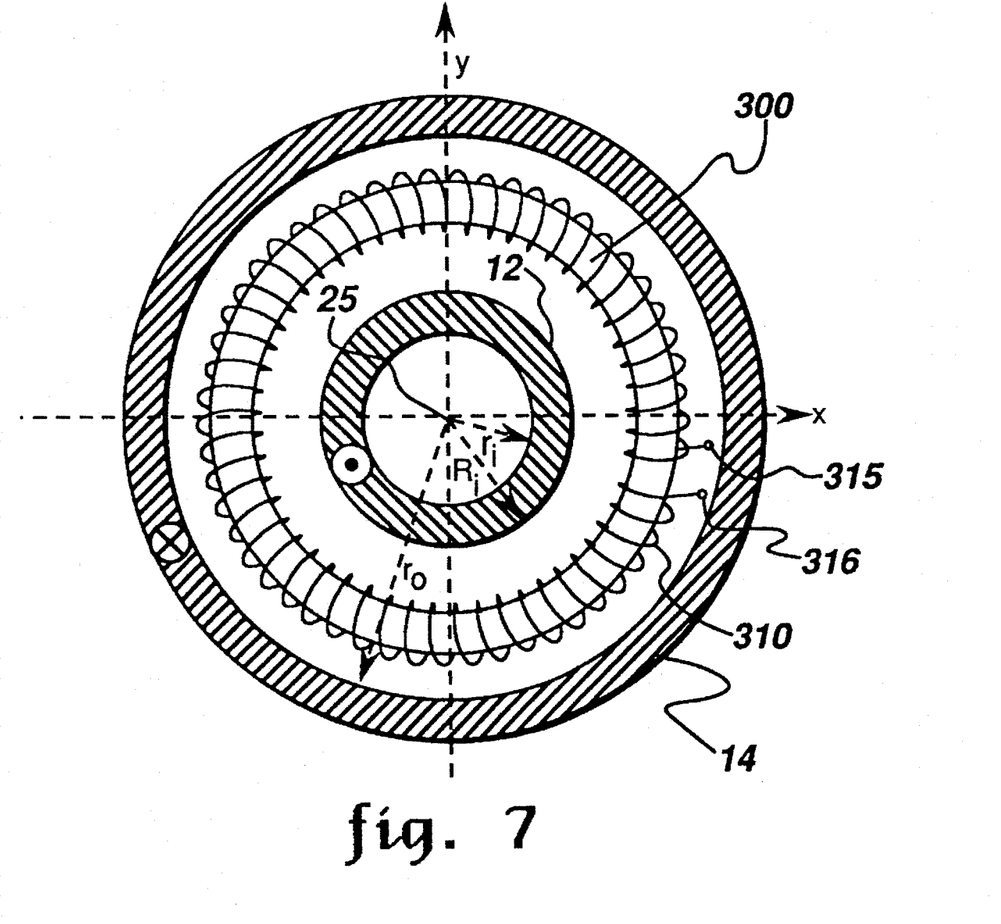
FIG. 7 shows the cross-sectional view of FIG. 4 including one exemplary embodiment of a flux sensor in accordance with the invention.

As shown in FIG. 7, instead of placing coils or other elements for sensing changes in magnetic flux in slots 24, a toroidal-shaped core 300, such as an air-core or Kapton™ embedded material, and a suitable coil 310 wound around core 300 may be inserted in the space between the outer pipe and the cylindrical element or inner pipe. Thus, by increasing the number of loops or turns in the sensing element of the current sensor, this has the desirable effect of increasing the dynamic range and accuracy of the current sensor. For this embodiment slots would not be necessary because sensing wires such as wires 315 and 316 between the outer pipe and cylindrical element could provide the induced voltage signal without a degradation in performance due to the effect of the magnetic field present.

Figure 8:
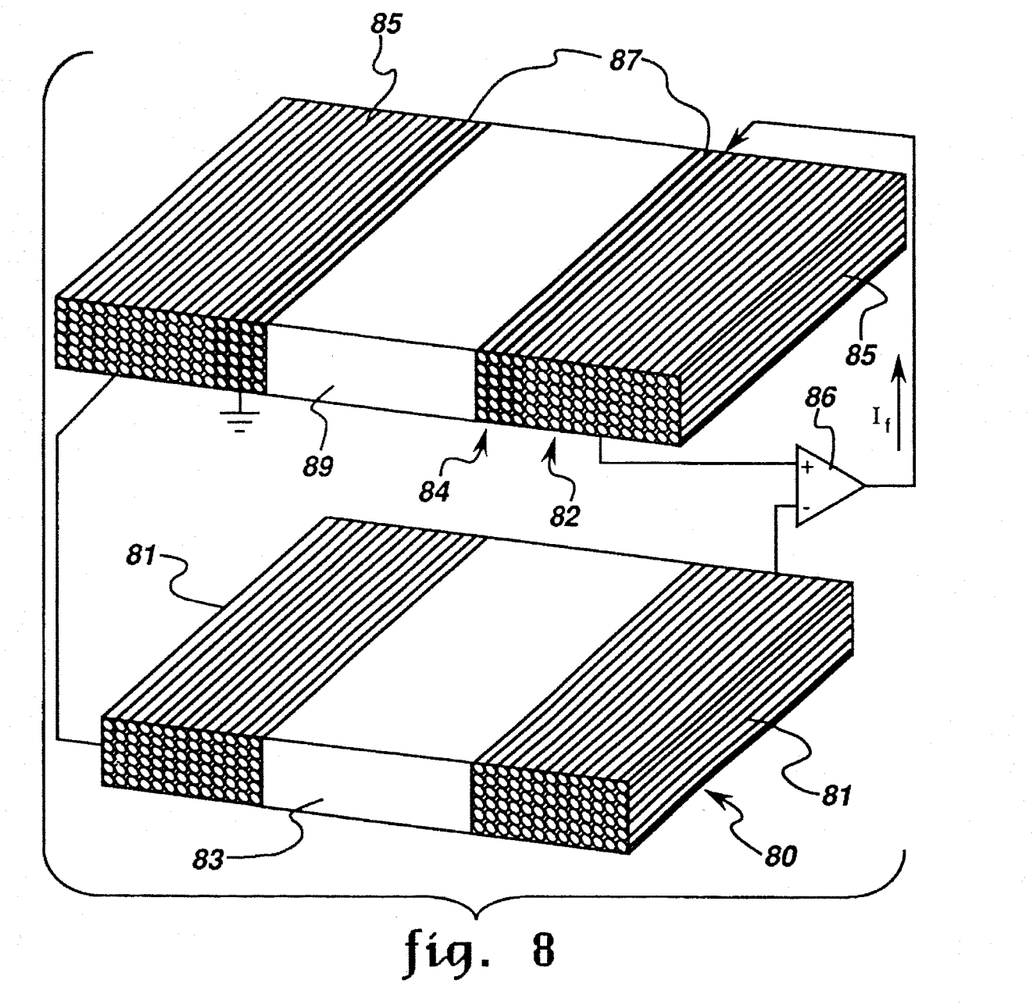
FIG. 8 shows a generally isometric view of an alternative embodiment of the flux sensor in accordance with the invention.

It will be appreciated that other detection schemes can be conveniently employed in a current sensor in accordance with the present invention. For example, as shown in FIG. 8, a reduced flux detection scheme can be conveniently employed in lieu or in combination with the mutual induction detection scheme previously described. One such reduced flux detection scheme is described in U.S. application Ser. No. 08/085,789, entitled "Reduced Time Rate of Change Magnetic Flux Current Sensor" by E. Berkcan, assigned to the assignee of the present invention and herein incorporated by reference. As shown in FIG. 8, the sensing means comprises a reference coil 80, a sense coil 82 and a feedback coil 84 magnetically coupled to one another within the predetermined sense region. A feedback generating circuit, such as an operational amplifier 86 or similar instrumentation amplifier, is responsive to the difference of respective AC signals being induced in reference coil 80 and in sense coil 82 for generating a feedback signal, such as current $I_f$, which is supplied to feedback coil 84 in order to predeterminedly reduce magnetic flux within the predetermined region. The feedback current $I_f$ in feedback coil 84 is proportional to the original or primary current I and provides an accurate current measurement. As shown in FIG. 8, reference coil 80 is made up of a winding 81 wrapped around a suitable core 83, preferably made of a nonmagnetic material, such as plastic material and the like. Although sense coil 82 and feedback coil 84 are shown as having respective windings 85 and 87 for sensing changes in magnetic flux over an area substantially in common or incorporated within the cross-sectional area of a common core 89, it will be appreciated that the sense coil 82 and feedback coil 84 need not sense changes in magnetic flux over any such substantially common area or incorporated within the cross-sectional area of the common core. However, it may be desirable for sense coil 82 to have a cross-sectional area substantially overlapping with the cross-sectional area of feedback coil 84. Similar to core 81, common core 89 is preferably made of plastic material and the like. Although the cross-sectional areas of the sensor coils are oriented substantially perpendicular to the direction of the magnetic field, it will now be appreciated that, either in the case of the mutual induction detection technique discussed above or the reduced flux detection technique discussed in the context of FIG. 8, the cross-sectional area of the sensor coils may be oriented at a predetermined angle with respect to the magnetic field other than substantially perpendicular so long as this orientation or predetermined angle is taken into account with regard to sensing and offsetting the changes in magnetic flux.

Figure 9A:
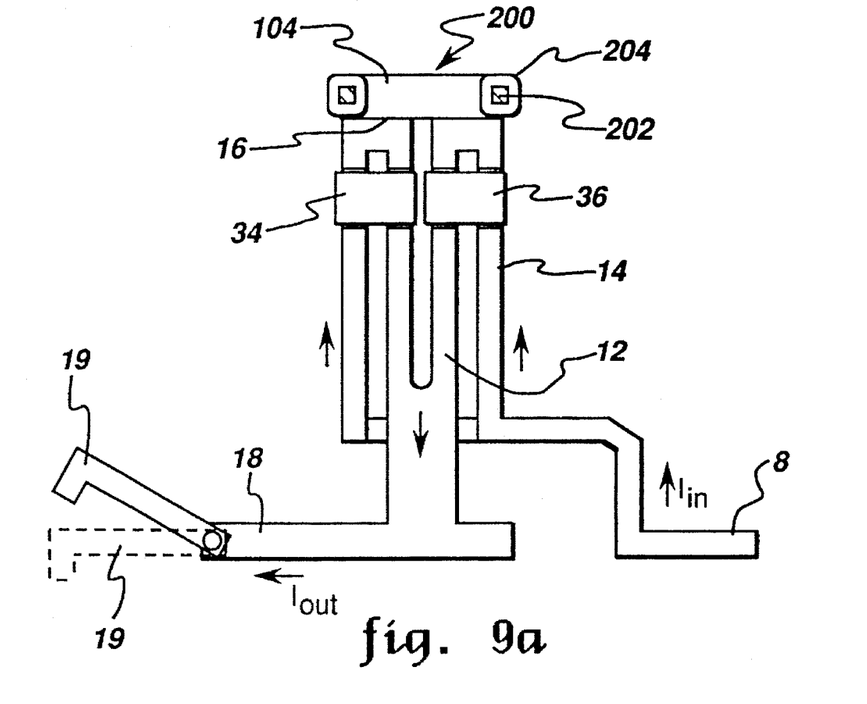
FIGS. 9a and 9b show, respectively, the embodiments of FIGS. 6a and 6b including an alternative location for the self-powering transformer in accordance with the invention.
Figure 9B:
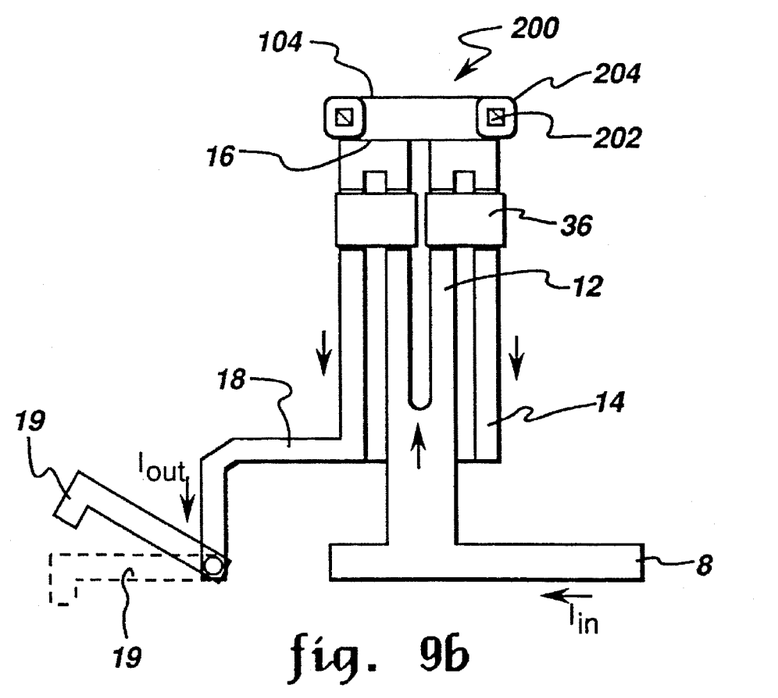

FIGS. 9a and 9b illustrate alternative embodiments for a current sensor in accordance with the present invention. In particular, FIGS. 9a and 9b show that the transformer region 104 need not be situated around inner pipe 12. For example transformer region 104, can be situated substantially adjacent to the respective second ends of the inner and outer pipes, over conductive end piece 16. Thus, in this embodiment, transformer 200, in lieu of being situated around inner pipe 12, can be conveniently situated near conductive end piece 16 for providing the separate self-powering capability. In operation, this alternate transformer region location again results in a current sensor having the various advantages stated above such as improved accuracy, reduced magnetic cross-coupling effects, and lower volume weight and manufacturing expenses.

A method for separately measuring alternative electrical current and providing electrical self-powering may be carried out in the following manner. An electrical current is conducted through a cylindrical-shaped conductive element in a first direction, such as conductive element 12. Electrical current is also conducted through a conductive cylindrical pipe in a second direction opposite the first direction, the pipe being substantially concentric with the conductive element, such as cylindrical pipe 14. Typically, the same current shah be conducted in both directions, although it will be appreciated that the invention is not limited in scope to the order of the electrical conduction through either the pipe or the cylindrical-shaped conductive element. However, in either case the two directions of conduction should oppose each other. This may be accomplished by a conductive bridge or washer, such as previously described, electrically connecting corresponding ends of the conductive element and concentric pipe. Thus, reversing polarity should have the effect of changing the order of electrical conduction through the pipe and cylindrical element.

The conductive element has an outer surface and the cylindrical pipe has an inner surface. Thus, the time rate of change of the magnetic flux over a predetermined sense region, such as in the space between the outer surface of the conductive element and the inner surface of the pipe may be measured. This may be measured in a number of different ways. For example, a changing magnetic flux sensing element or sensor, such as one or more air coils, may be located in the space between the outer surface of the conductive element and the inner surface of the pipe. Likewise, the coils may be located in the space through slots in the pipe or pipes, as previously described. Finally, a predetermined level of electrical current is generated over a predetermined transformer region, such as described above. Preferably, the sense and transformer region are substantially nonoverlapping with respect to one another so as to avoid magnetic cross-coupling effects.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An alternating current sensor comprising:

a conductive pipe having a first end, a second end, an inner surface, an outer surface, and a major axis extending from the first end to the second end;

a cylindrical-shaped conductive element, at least partially surrounded by said pipe, having a first end, a second end, and a major axis extending from the first end of said conductive element to the second end of said conductive element;

a conductor electrically connecting the respective second ends of said pipe and said conductive element to form a connected conductive path between the first end of said pipe and the first end of said conductive element;

said pipe and said conductive element being spaced apart a predetermined radial distance to form a magnetic field in the space between said pipe and said conductive element during current flow along said connected conductive path;

a sensor for sensing changes in magnetic flux over a predetermined sense region situated substantially in the space between said pipe and said conductive element; and transformer means being responsive to a magnetic field over a predetermined transformer region situated outside the first end of said pipe and within any magnetic field formed by said pipe and said conductive element during current flow along said connected conductive path for generating a predetermined level of electrical current, said sense region and said transformer region being substantially nonoverlapping with respect to one another, said transformer means comprising a magnetic core situated in said transformer region, and a winding responsive to magnetic flux changes in said magnetic core so as to generate said predetermined level of electrical current.

2. The alternative current sensor of claim 1 wherein the first end of said conductive element extends beyond the first end of said pipe and wherein said transformer means is situated around said conductive element between the first ends of said conductive element and said pipe.

3. The alternating current sensor of claim 1 wherein the second ends of said pipe and said conductive element are substantially coplanar and wherein said transformer region is situated substantially adjacent to the second ends of said pipe and said conductive element.

4. The alternative current sensor of claim 1 wherein the magnetic field formed in the space between said pipe and said conductive element during current flow along said connected conductive path is substantially constant in angular direction.

5. The alternative current sensor of claim 4 wherein said pipe has at least one slot extending from the inner surface to the outer surface of said pipe, said slot being shaped to receive the sensor for sensing magnetic flux changes over the sense region.

6. The alternative current sensor of claim 5 and further comprising another magnetic flux sensor for sensing magnetic flux changes over the sense region, said pipe having at least one other slot extending from the inner surface to the outer surface of said pipe;

said one other slot being shaped to receive said another magnetic flux sensor.

7. The current sensor of claim 5 wherein said conductive element is in the form of another conductive pipe;

said another conductive pipe having an inner surface, an outer surface, and a slot extending from the inner surface to the outer surface of said another conductive pipe;

the slots in said pipes being substantially overlapping.

8. The alternating current sensor of claim 7 further comprising at least one additional magnetic flux sensor for sensing magnetic flux changes over the sense region;

wherein each respective conductive pipe has at least one additional slot, the one additional slot extending from the inner surface to the outer surface of the respective conductive pipe;

the one additional slot in said pipes being substantially overlapping and adapted to receive said at least one additional magnetic flux sensor.

9. The alternating current sensor of claim 8 wherein the magnetic flux sensors in said sense region comprise two coils connected in series, the two coils having substantially identical cross-sectional areas and substantially the same number of coil loops, the cross-sectional area of the two coils being oriented substantially mutually perpendicular.

10. The alternating current sensor of claim 9 wherein said two coils comprise respective air-coils.

11. The alternating current sensor of claim 7 wherein the magnetic flux sensor comprises a reference coil, a sense coil, and a feedback coil magnetically coupled to each other for reducing magnetic flux changes within the predetermined sense region.

12. The alternating current sensor of claim 4 wherein the magnetic flux sensor comprises a toroidal-shaped coil having a plurality of coil loops, said coil being positioned in the space between the outer surface of said conductive element and the inner surface of said pipe.

13. The alternating current sensor of claim 12 wherein said toroidal coil is wound around a non-magnetic material.

14. A method for separately measuring alternating electrical current and providing electrical self-powering, said method comprising steps of:

conducting electrical current through a cylindrical-shaped conductive element in a first direction, said conductive element having a first end, a second end, an inner surface and an outer surface;

conducting electrical current through a conductive cylindrical pipe in a second direction substantially opposite the first direction, said pipe being substantially concentric with said conductive element and having a first end, a second end, an inner surface and an outer surface;

measuring magnetic flux changes over a predetermined sense region in a space between said pipe and said conductive element; and generating, over a predetermined transformer region situated outside the first end of said pipe and within any magnetic field formed by said electrical current in said pipe and said electrical current in said conductive element, a predetermined level of current for electrical self-powering, said sense and transformer regions being substantially nonoverlapping with respect to one another.

15. The method of claim 14 wherein the electrical current conducted in the first direction and the electrical current conducted in the second direction are substantially the same current.

16. The method of claim 15, and further comprising the step of converting the measurement of magnetic flux changes in the sense region to a current measurement, said current measurement being substantially free of electromagnetic effects due to the electrical self-powering.

17. The method of claim 16 further comprising the step of arranging said conductive element and said pipe so that said conductive element and said pipe, respectively, comprise inner and outer pipes relative to one another.

18. The method of claim 17 further comprising the step of predeterminedly extending the first end of said inner pipe relative to the first end of said outer pipe.

19. The method of claim 18 further comprising the step of locating the transformer region between the first ends of said pipes.

20. The method of claim 17 further comprising the step of coplanarly situating each second end of said pipes.

21. The method of claim 20 further comprising the step of locating the transformer region substantially adjacent to the second ends of said pipes.

22. The method of claim 17 wherein the respective steps of conducting electrical current allow for inducing a magnetic field having a magnitude substantially in accordance with the following equations:

$$H(r) = \begin{cases} 0, & r \leq r_i, r \geq R_o \\ \dfrac{I}{2\pi r} \dfrac{r^2 - r_i^2}{R_i^2 - r_i^2} & r_i \leq r \leq R_i \\ \dfrac{I}{2\pi r} & R_i \leq r \leq r_o \\ \dfrac{I}{2\pi r} \dfrac{R_o^2 - r^2}{R_o^2 - r_o^2} & r_o \leq r \leq R_o \end{cases}, \quad [1]$$

where $r_i$ is the radius of the inner surface of the inner pipe;

$R_i$ is the radius of the outer surface of the inner pipe;

$r_o$ is the radius of the inner surface of the outer pipe; and $R_o$ is the radius of the outer surface of the outer pipe; and r is the radius of an imaginary cylinder substantially concentric with the inner and outer pipes.

23. The method of claim 22 wherein the predetermined sense region over which magnetic flux changes are measured is within $r_i < r < R_o$.

\* \* \* \* \*